United States Patent
Gan et al.

(10) Patent No.: US 7,199,666 B2
(45) Date of Patent: Apr. 3, 2007

(54) CONSTRUCTION AND USE OF PREAMPS HAVING DISCRETE GAIN STATES

(75) Inventors: Say Hyan Gan, Singapore (SG); Irene Quek, Singapore (SG); Ngee Ching Lim, Singapore (SG)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 105 days.

(21) Appl. No.: 11/077,045

(22) Filed: Mar. 10, 2005

(65) Prior Publication Data

US 2006/0202765 A1  Sep. 14, 2006

(51) Int. Cl.
*H03F 3/08* (2006.01)

(52) U.S. Cl. .................. 330/308; 330/278; 330/291

(58) Field of Classification Search ............ 330/133, 330/291; 250/214 AG
See application file for complete search history.

(56) References Cited

U.S. PATENT DOCUMENTS

| | | | | |
|---|---|---|---|---|
| 5,952,883 A | * | 9/1999 | Masuta | 330/279 |
| 6,397,090 B1 | * | 5/2002 | Cho | 455/574 |
| 6,452,452 B1 | * | 9/2002 | Furino, Jr. | 330/278 |
| 6,509,796 B2 | * | 1/2003 | Nguyen et al. | 330/254 |
| 6,882,226 B2 | * | 4/2005 | Cho et al. | 330/282 |
| 6,985,036 B2 | * | 1/2006 | Bhattacharjee et al. | 330/254 |
| 2004/0202476 A1 | | 10/2004 | Woolf et al. | |
| 2006/0081779 A1 | * | 4/2006 | Yeo et al. | 250/338.1 |

FOREIGN PATENT DOCUMENTS

JP  06224652 A  *  8/1994

OTHER PUBLICATIONS

Kucharski, et al., "A Low-Power 10Gb/s AGC Optical Postamplifier in SiGe", IEEE, 2004, 4 pages.
Rui Tao, et al., "Wideband fully differential CMOS transimpedance preamplifier", Electronic Letters, Oct. 16, 2003, vol. 39. No. 21, 2 pages.

* cited by examiner

*Primary Examiner*—Benny Lee
*Assistant Examiner*—Alan Wong

(57) ABSTRACT

In one embodiment, the linear gain region of a preamp is widened by performing the following actions within the preamp: converting a received input current to a first voltage; in accordance with one of a plurality of discrete gain states, amplifying the first voltage to produce a second voltage; in response to the received input current crossing one or more thresholds, switching the gain state used for amplifying the first voltage; and outputting an indication of the preamp's current gain state. Preamps for performing this and other methods are also disclosed.

19 Claims, 6 Drawing Sheets

CONSTRUCTION AND USE OF PREAMPS HAVING DISCRETE GAIN STATES

BACKGROUND

An exemplary fiber optic receiver 100 is illustrated in FIG. 1. The receiver 100 comprises a photosensitive input element 102 (e.g., a photodiode), a preamplifier (preamp 104), a postamplifier (postamp 106) generating a receiver output $V_1$, and an optional one or more post processing circuits 108 generating a receiver output X.

In the receiver 100, the role of the preamp 104 is to convert currents (I) generated by the photosensitive input element 102 into corresponding voltages ($V_O$). The postamp 106 then provides additional amplification to the voltage $V_O$, so as to saturate its output voltage ($V_1$) to a certain level.

In some cases, a receiver's postprocessing circuit(s) 108 may employ optical modulation amplitude (OMA) readback, which is a readback of the difference between a received optical signal's logic-one and logic-zero power levels. OMA readback can be useful as a real time digital diagnostic for determining the optical power of received signals. By way of example, in fiber channel and ethernet receivers, OMA readback can be used to detect broken or faulty optical fibers, or the lack of an input signal.

In receivers where OMA readback is a requirement, it is desirable that the receiver's preamp 104 be operated with a linear gain (i.e., a gain which causes its output to vary linearly with its input). However, the extent of a preamp's linear gain region is limited by at least three factors: postamp sensitivity, preamp supply voltage, and preamp gain magnitude. As shown in FIG. 2, the sensitivity 202 of the postamp 106, in combination with the magnitude of its corresponding preamp's gain, defines the lower end "A" of the preamp's linear gain region (i.e., "Linear Gain Region 1"). Similarly, the preamp's supply voltage 200, in combination with the magnitude of the preamp's gain, defines the upper end "B" of the preamp's linear gain region. Within these confines, the magnitude of the preamp's gain determines the extent (or width) of the preamp's linear gain region. Thus, if the gain of the preamp 104 increases from "Gain 1" to "Gain 2", the linear gain region of the preamp 104 will shrink to that of "Linear Gain Region 2".

As fiber optic technology progresses (e.g., as optical communication links get longer and optical signaling powers decrease), an optical receiver's preamp 104 needs to detect ever-smaller inputs and hence have a good signal-to-noise ratio and better sensitivity. At the same time, it remains desirable for the preamp 104 to have a wide linear gain region and acceptable overload performance (i.e., acceptable operation at higher optical powers). Unfortunately, better preamp sensitivity typically dictates a need for higher gain, while a wide linear gain region and better overload performance typically dictate a need for lower gain.

One way to provide a preamp 104 with better sensitivity, a wide linear gain region, and acceptable overload performance is to incorporate variable gain control circuitry into its receiver 100. Variable gain control circuitry operates to increase a preamp's gain as input power decreases, and then decrease the preamp's gain as input power increases, thereby providing the preamp 104 with better sensitivity at low input powers while preventing the preamp's output from saturating at high input powers. However, the use of variable gain control circuitry results in a variable relationship between a preamp's input (I) and output ($V_O$), thereby making OMA readback difficult.

SUMMARY OF THE INVENTION

In one embodiment, a method for widening the linear gain region of a preamp comprises performing the following actions within the preamp: converting a received input current to a first voltage; in accordance with one of a plurality of discrete gain states, amplifying the first voltage to produce a second voltage; in response to the received input current crossing one or more thresholds, switching the gain state used for amplifying the first voltage; and outputting an indication of the preamp's current gain state.

In another embodiment, a preamp comprises an input amplifier, a voltage amplifier and a gain control circuit. The input amplifier produces a first voltage in response to a received input current. The voltage amplifier amplifies the first voltage to produce a second voltage, in accordance with one of a plurality of discrete gain states. The gain control circuit 1) switches the gain state of the voltage amplifier in response to the received input current crossing one or more thresholds, and 2) outputs an indication of the voltage amplifier's current gain state to circuitry downstream from the preamp.

Other embodiments are also disclosed.

BRIEF DESCRIPTION OF THE DRAWINGS

Illustrative embodiments of the invention are illustrated in the drawings, in which.

DETAILED DESCRIPTION OF AN EMBODIMENT

Figure 1:
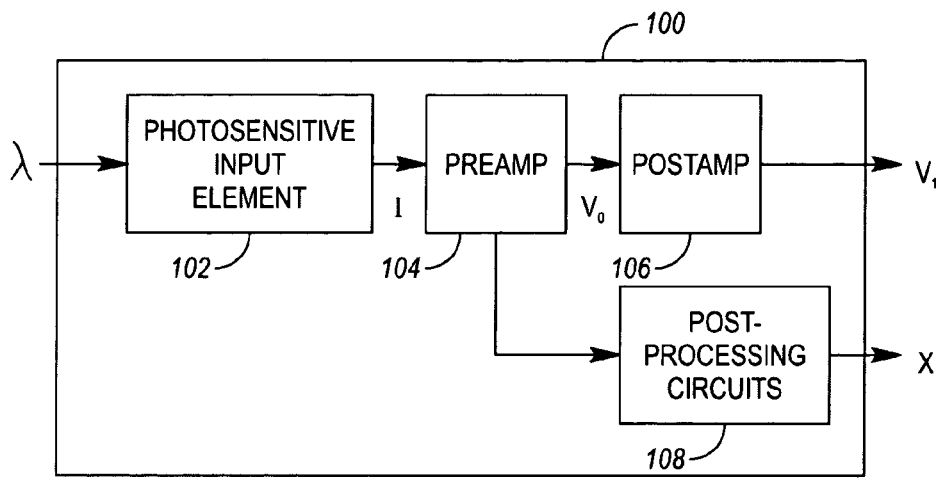
FIG. 1 illustrates an exemplary fiber optic receiver.
Figure 2:
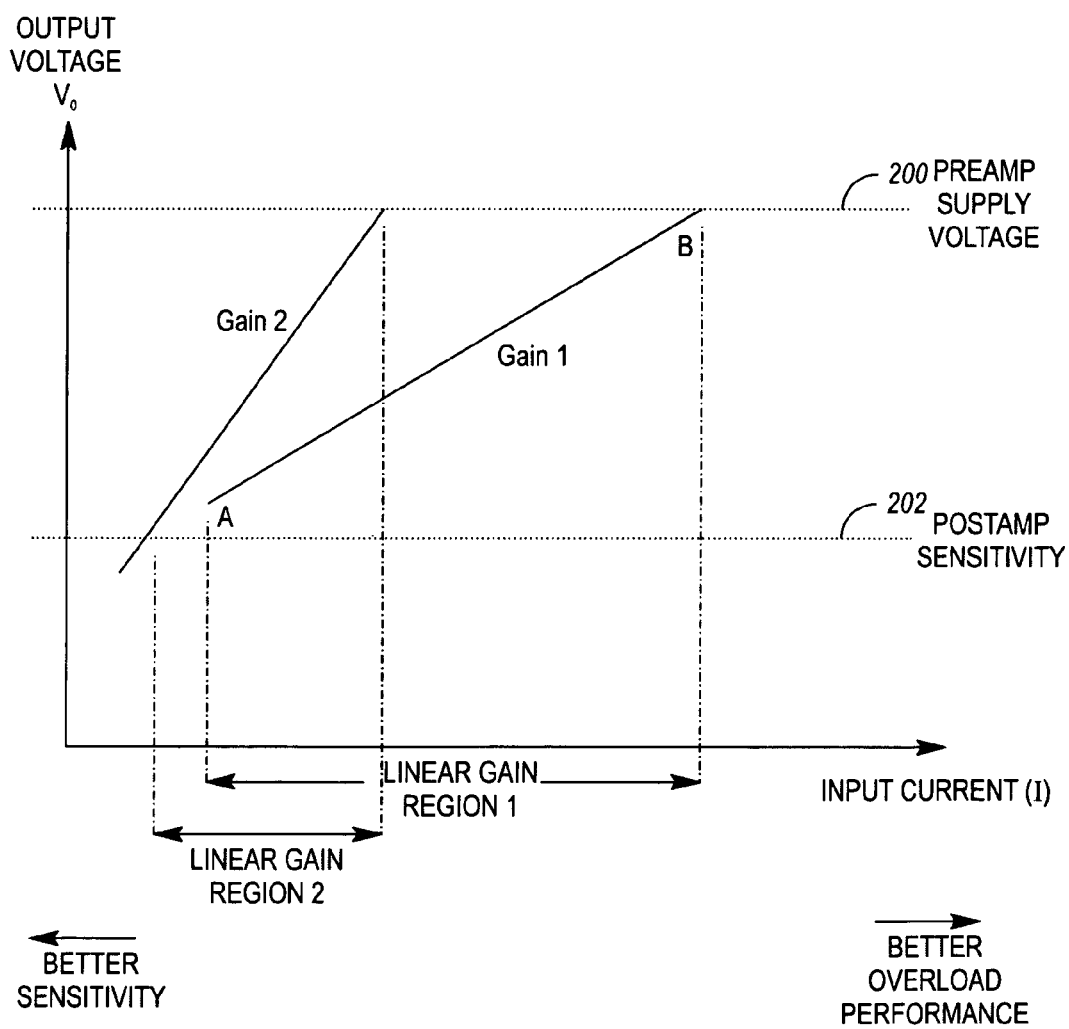
FIG. 2 illustrates various factors that limit the linear gain region of the preamp shown in FIG. 1.
Figure 3:
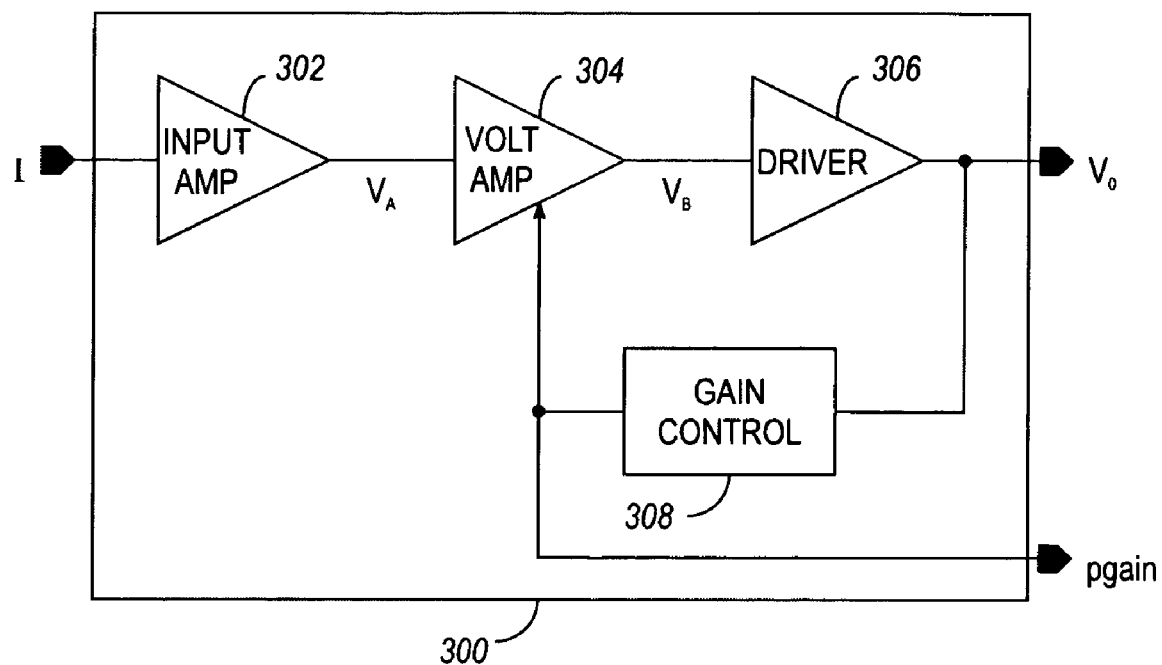
FIG. 3 illustrates a first exemplary embodiment of the preamp shown in FIG. 1.

FIG. 3 illustrates a first exemplary embodiment 300 of the preamp 104 shown in FIG. 1. The preamp 300 comprises an input amplifier 302, a voltage amplifier 304, a gain control circuit 308, and an output driver 306. The input amplifier 302 may take a number of forms, including that of a high gain amplifier, a low gain amplifier, or a transimpedance amplifier (TIA). However, the input amplifier 302 is preferably a TIA, in that a TIA is typically capable of responding to a wider range of input currents. In response to an input current, I, received from a photosensitive input element 102 (e.g., a photodiode), the input amplifier 102 produces a first voltage, $V_A$.

The voltage amplifier 304 has a programmable gain that is programmed to correspond to one of a plurality of discrete gain states. The voltage amplifier 304 receives the voltage, $V_A$, produced by the input amplifier 302 and, in accordance with its programmed gain, produces a second voltage, $V_B$. This second voltage is then buffered (and possibly amplified) by the output driver 306.

The gain control circuit 308 is provided for switching the gain state of the voltage amplifier 304 in response to the received input current, I, crossing one or more thresholds. In one embodiment, the gain control circuit 308 responds to the received input current by sampling the voltage $V_O$ output by the output driver 306. However, the gain control circuit 308 may also respond to the received input current by sampling the voltage $V_B$ output by the voltage amplifier. Although the gain control circuit 308 may respond to a peak voltage output of the voltage amplifier 304 or output driver 306, it preferably responds to the amplitude (i.e., output swing) of the voltage output by the amplifier 304 or driver 306.

In addition to switching the gain state of the voltage amplifier 304, the gain control circuit 308 outputs an indication (pgain) of the voltage amplifier's current gain state to circuitry downstream from the preamp 300 (e.g., the postamp 106, or one or more postprocessing circuits 108).

Figure 4:
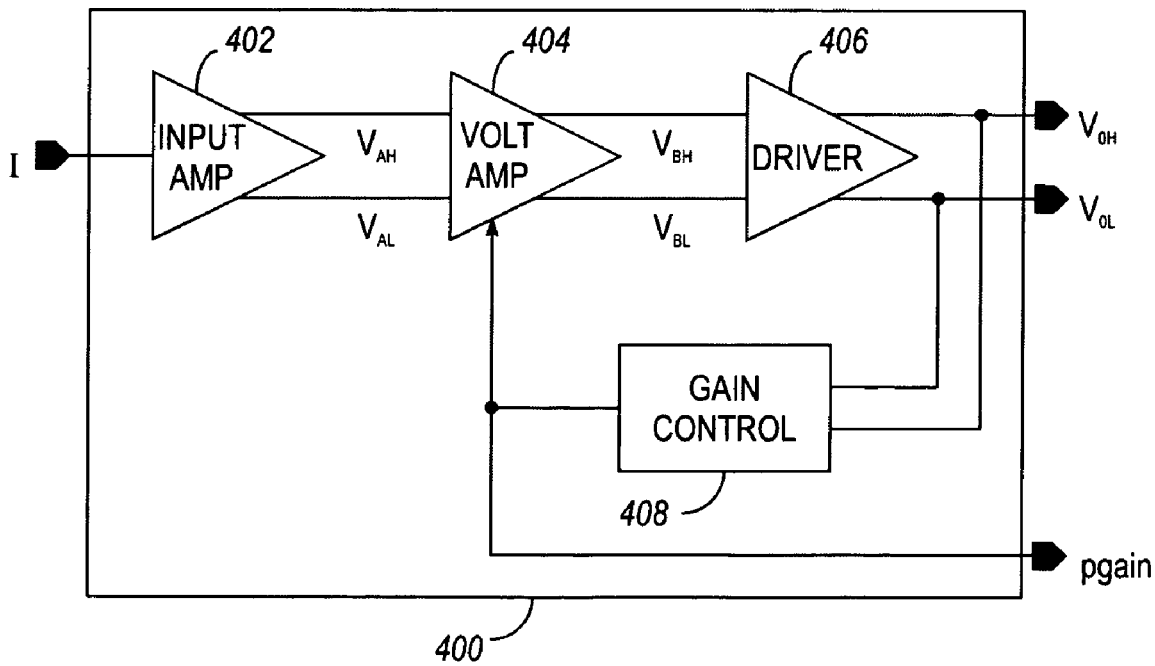
FIG. 4 illustrates a second exemplary embodiment of the preamp shown in FIG. 1.

FIG. 4 illustrates a second exemplary embodiment 400 of the preamp 104 shown in FIG. 1. Similarly to the preamp 300, the preamp 400 comprises an input amplifier 402, a voltage amplifier 404, a gain control circuit 408, and an output driver 406. However, the preamp 400 differs from the preamp 300 in that the voltages output by its various amplifiers 402, 404 and output driver 406 are differential voltages. A preamp's use of differential voltages is useful in that it provides a more stable and noise-resistant output ($V_{OH}$, $V_{OL}$). In this second embodiment, the gain control circuit 408 responds to a received input current, I, by measuring the amplitude (i.e., output swing) of the voltage output by the amplifier 404 or output driver 406.

Figure 5:
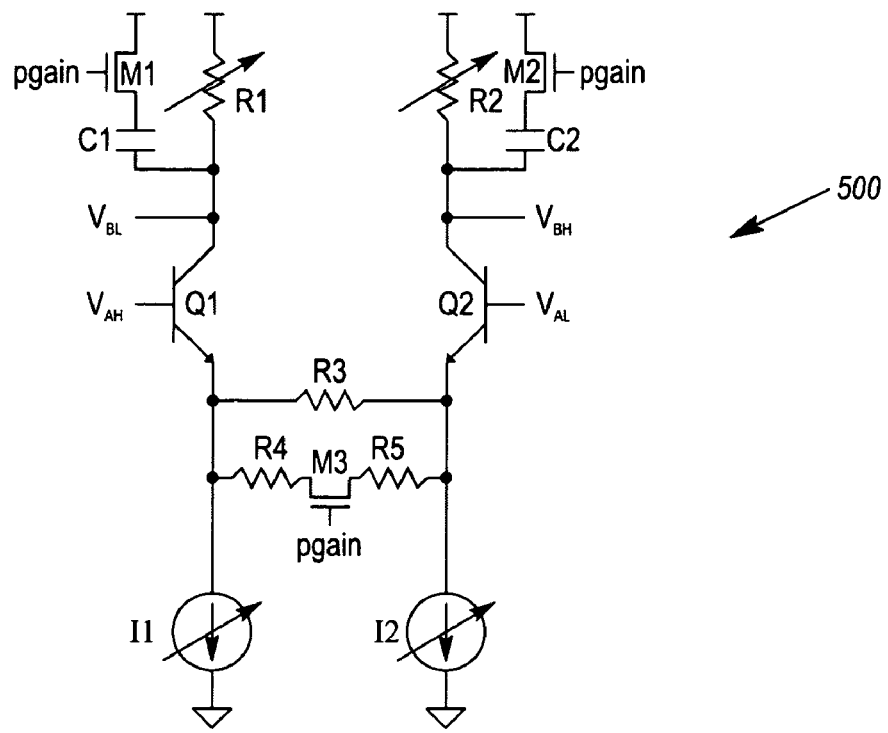
FIGS. 5 & 6 illustrate alternate exemplary embodiments of the voltage amplifier shown in FIG. 4.
Figure 6:
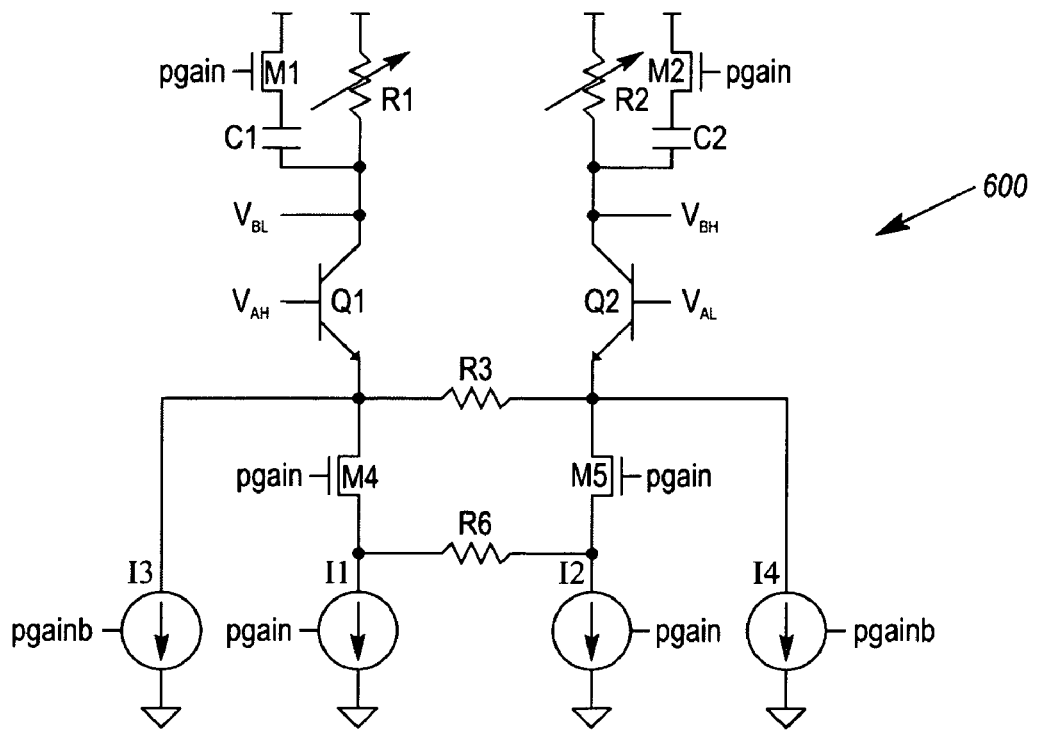

FIGS. 5 & 6 illustrate two exemplary implementations 500, 600 of the voltage amplifier 404. In each implementation 500, 600, a differential input voltage ($V_{AH}$, $V_{AL}$) is received at the bases of a differential pair of bipolar transistors (Q1, Q2), and a differential output voltage ($V_{BH}$, $V_{BL}$) is output from the collectors of the transistors. To set the gain of each amplifier implementation 500, 600, different combinations of variable collector resistors (R1, R2), variable emitter resistors (R3, R4, R5, R6), variable current sources (I1, I2, I3, I4) and metal-oxide semiconductor (MOS) switches (M3, M4, M5) are configured/controlled by the output (pgain) of the gain control circuit 408, or the inverse output (pgainb) of the gain control circuit 408. In some cases, the voltage amplifier 404 may comprise a plurality of stages, some or all of which may be configured/controlled by the output(s) of the gain control circuit 408 to set the gain of the voltage amplifier 404. Note that the voltage amplifier implementations 500, 600 shown in FIGS. 5 & 6 also comprise a pair of switched capacitors (C1/M1, C2/M2) to prevent spiking of the amplifier's output at low gain.

Figure 7:
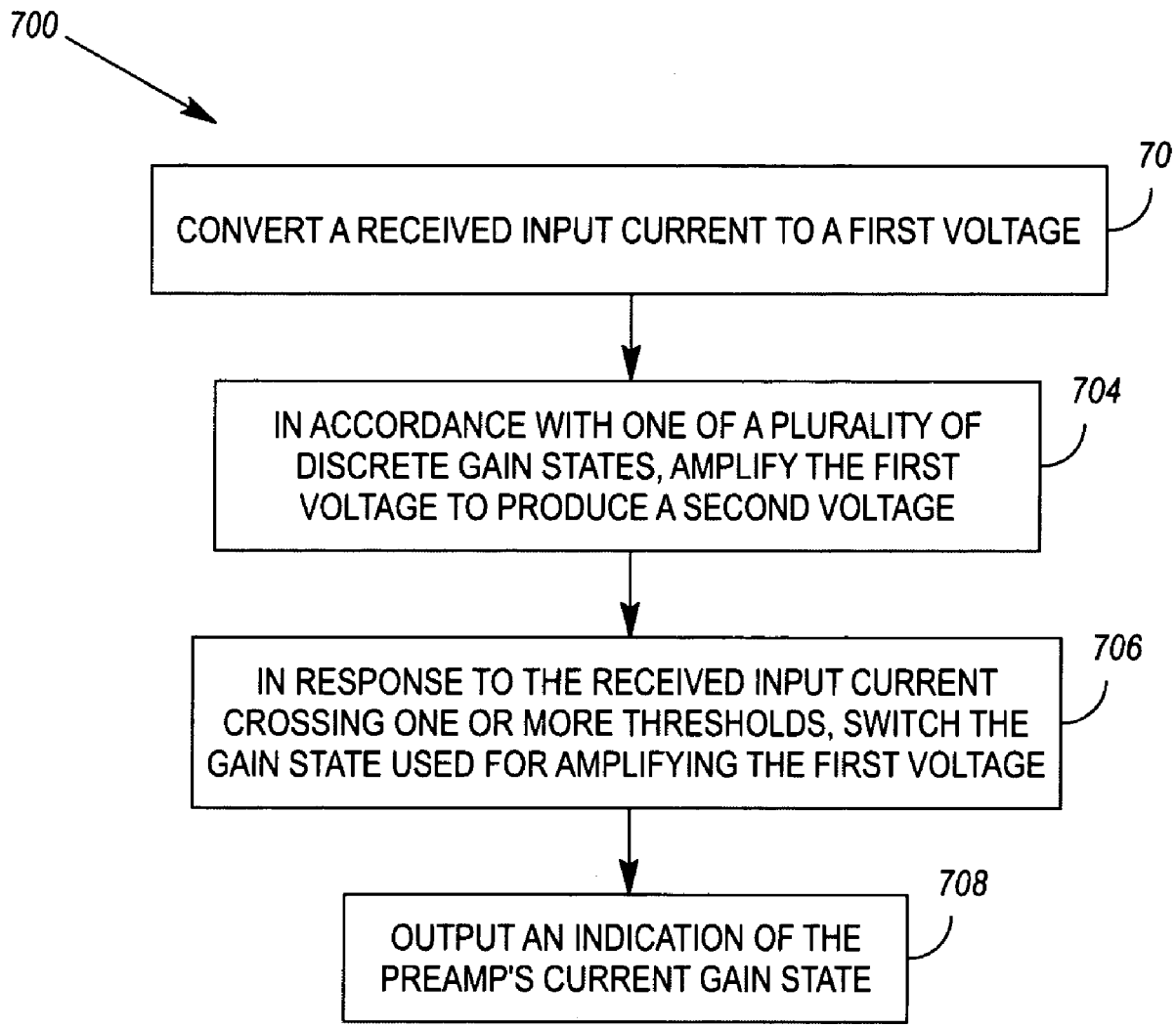
FIG. 7 illustrates an exemplary method for widening the linear gain region of a preamp.

FIG. 7 illustrates an exemplary method 700 for widening the linear gain regions of, for example, the preamps 300, 400 shown in FIGS. 3 & 4. The method 700 comprises performing the following actions within the preamp. First, a received input current is converted 702 to a first voltage (e.g., by an input amplifier 302, 402). In accordance with one of a plurality of discrete gain states, the first voltage is then amplified 704 to produce a second voltage (e.g., by a voltage amplifier 304, 404). As the received input current varies, 1) the gain state used for amplifying the first voltage is switched 706 in response to the received input current crossing one or more thresholds, and 2) an indication of the preamp's current gain state is output 708 from the preamp 300, 400.

Having described various embodiments 300, 400 of the preamp 100, as well as a method 700 for widening the linear gain region of a preamp 300, 400, an exemplary application of the method 700 to the preamp 400 will now be described.

Figure 8:
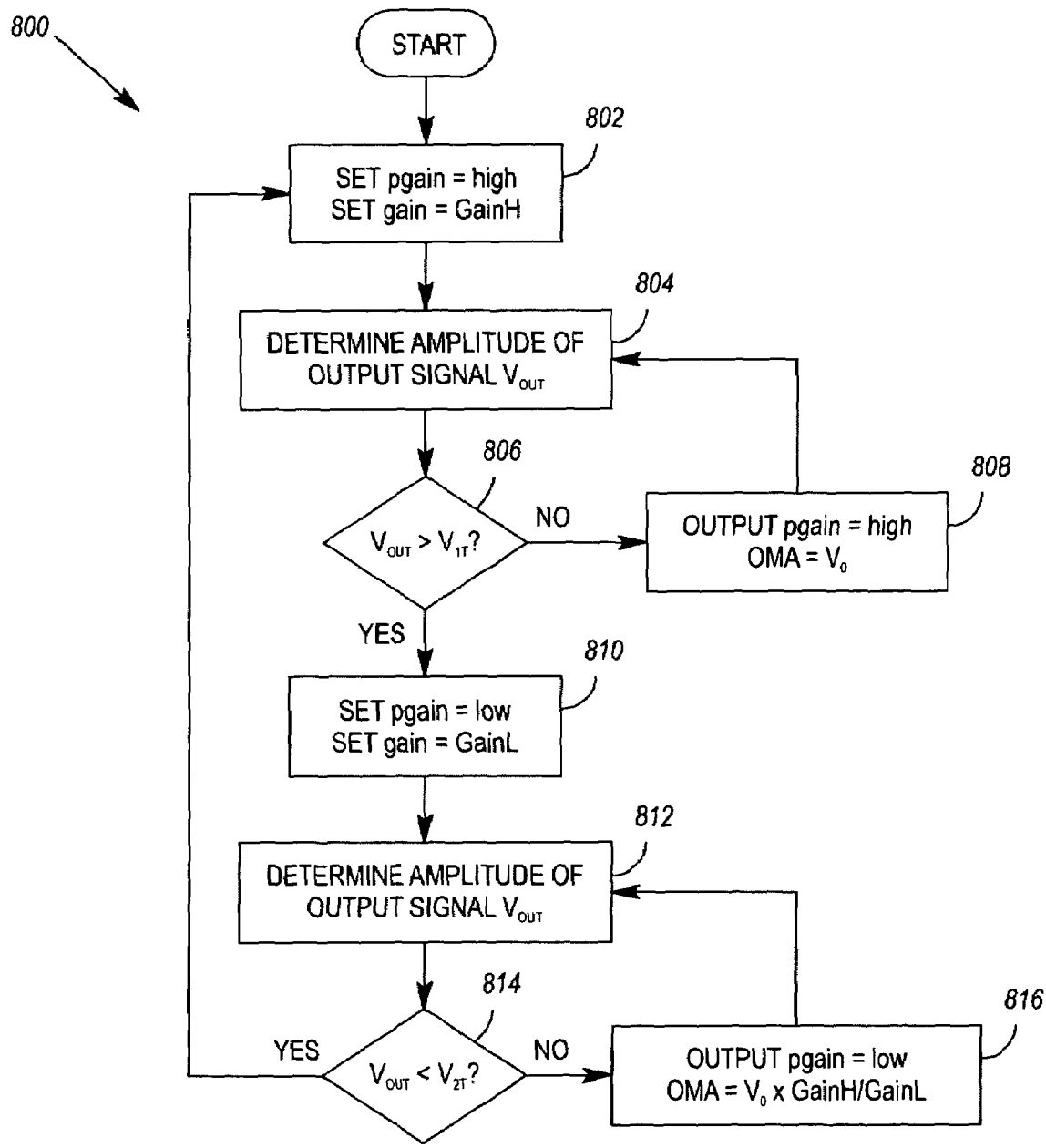
FIG. 8 illustrates an exemplary operation of the preamp shown in FIG. 4, wherein the voltage amplifier of the preamp is provided with two gain states.
Figure 9:
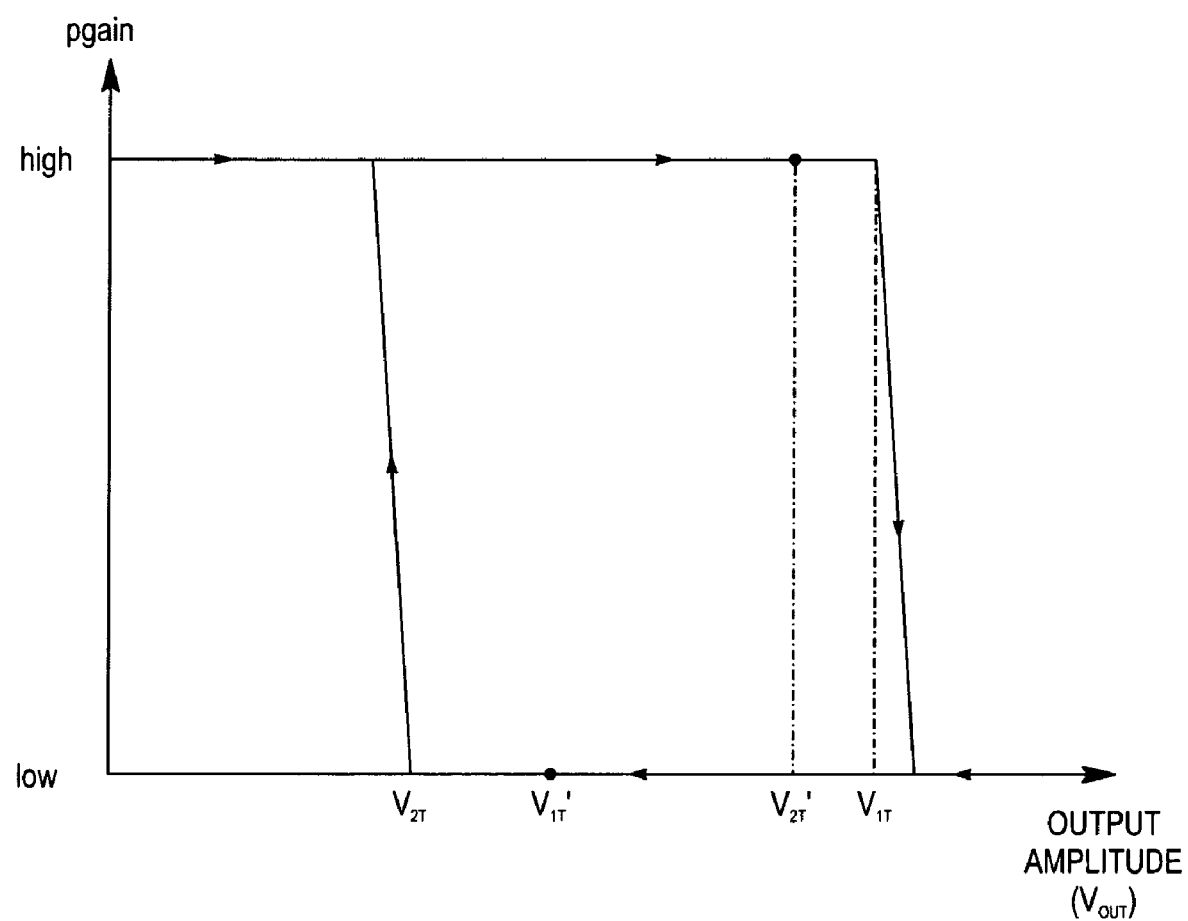
FIG. 9 illustrates a plot of gain versus output voltage corresponding to the preamp operation shown in FIG. 8.

FIGS. 8 & 9 illustrate the operation of preamp 400 with a voltage amplifier 404 having two gain states: a high gain state (GainH) and a low gain state (GainL). By way of example, the voltage amplifier 404 is initially set 802 to its high gain state (pgain=high; gain=GainH). Upon receiving an optical transmission, the gain control circuit 408 periodically or continuously samples the preamp's output ($V_O$) to determine 804 its amplitude $V_{OUT}$ (i.e., its output swing). If the gain control circuit 408 determines 806 that the amplitude $V_{OUT}$ is less than a threshold $V_{1T}$, the gain control circuit 408 maintains 808 the gain of the voltage amplifier 404 at GainH. If, however, the gain control circuit 408 determines 806 that the amplitude $V_{OUT}$ is greater than the threshold $V_{1T}$, the gain control circuit 408 sets 810 pgain=low, thereby switching the gain of the voltage amplifier 404 to its low gain state (gain=GainL).

While the voltage amplifier 404 is in its low gain state, the gain control circuit 408 continues to sample the preamp's output ($V_O$) and determine 812 its amplitude, $V_{OUT}$. If the gain control circuit 408 determines 814 that the amplitude $V_{OUT}$ is greater than a threshold $V_{2T}$, the gain control circuit 408 maintains 816 the gain of the voltage amplifier 404 at GainL. If, however, the gain control circuit 408 determines 814 that the amplitude $V_{OUT}$ is less than the threshold $V_{2T}$, the gain control circuit 408 sets 802 pgain=high, thereby switching the gain of the voltage amplifier 404 back to GainH.

In some cases, the thresholds $V_{1T}$ and $V_{2T}$ may be the same threshold. However, to avoid oscillation of the preamp's output as a result of noise, it may be desirable to program the gain control circuit 408 with the largest hysteresis possible (i.e., largest separation between $V_{1T}$ and $V_{2T}$) that still allows valid signal transitions to be detected. In this manner, the voltages $V_{1T}'$ and $V_{2T}'$ (see FIG. 9) will not cause the gain of the voltage amplifier 404 to switch. The other limitations on $V_{1T}$ and $V_{2T}$ are that $V_{1T}$ must be set lower than the saturation level of the preamp 400, and $V_{2T}$ must be set higher than the minimum input required by any downstream postamp 106 (FIG. 1).

When the preamp 400 is operated as shown in FIGS. 8 & 9, and used for OMA readback, OMA readback may be calculated as follows:

if pgain=high, OMA readback=$V_O$;

if pgain=low, OMA readback=$V_O \times$(GainH/GainL)

In this manner, the quantity GainH/GainL, can be considered a "gain factor". Thus, when a voltage amplifier's gain is high, an OMA readback circuit can set the gain factor to "1"; and when the voltage amplifier's gain is low, the OMA readback circuit can set the gain factor to "GainH/GainL" (which can be measured during a receiver's calibration).

In some cases, it may be desirable to form the input amplifier 402, voltage amplifier 404, gain control circuit 408 and output driver 406 on a single integrated circuit. In this manner, the threshold(s) and hysteresis of the preamp 400 may be set by internal circuitry so that they better respond to environmental and process changes.

Depending on their application, the preamps 300, 400 shown in FIGS. 3 & 4 may provide various advantages over other preamps. For example, the preamps 300, 400 can be provided with wider linear gain regions than preamps employing only a single, fixed gain. In addition, their wider linear gain regions can include a high gain region that increases the preamps' sensitivities. And, in contrast to variable gain control circuitry, which continuously varies a preamp's output in response to its input, thereby introducing gain changes that cannot be fully calibrated out during OMA readback, a preamp 300, 400 having discretely switched gain states, coupled with an ability to indicate its current gain state to downstream circuitry (e.g., postamp 106; or post-processing circuit(s) 108, including, for example, an OMA readback circuit), makes it well-suited for accurate OMA readback. It is also noted that the preamps 300, 400 disclosed herein may be used to provide a fully analog gain control solution, which also improves OMA readback accuracy.

Although the preamps 300, 400 disclosed herein are designed for use in fiber optic receivers 100, it is noted that the principles of their design can be applied to other types of preamps (e.g., electrical or audio preamps).

What is claimed is:

1. A preamp, comprising:
   an input amplifier that produces a first voltage in response to a received input current;
   a voltage amplifier that amplifies the first voltage to produce a second voltage, in accordance with a voltage gain that corresponds to one of a plurality of discrete gain states; and
   a gain control circuit to i) switch the gain state of the voltage amplifier in response to the received input current crossing one or more thresholds, and ii) output an indication of the voltage amplifier's current gain state to circuitry downstream from the preamp, wherein the downstream circuit includes an optical modulation amplitude readback circuit that generates an optical modulation amplitude readback output in response to the indication received from the gain control circuit.

2. The preamp of claim 1, further comprising an output driver that receives the second voltage and outputs a third voltage.

3. The preamp of claim 2, wherein the gain control circuit responds to the received input current by sampling the third voltage.

4. The preamp of claim 3, wherein the first, second and third voltages are differential voltages.

5. The preamp of claim 2, wherein the gain control circuit responds to the received input current by measuring an amplitude of the third voltage.

6. The preamp of claim 1, wherein the input amplifier is a transimpedance amplifier.

7. The preamp of claim 1, wherein the voltage amplifier comprises a plurality of stages.

8. The preamp of claim 1, wherein the voltage amplifier comprises at least one variable resistance that is controlled by the gain control circuit to switch the gain state of the voltage amplifier.

9. The preamp of claim 1, wherein the voltage amplifier comprises at least one variable current source that is controlled by the gain control circuit to switch the gain state of the voltage amplifier.

10. The preamp of claim 1, wherein the gain states of the voltage amplifier consist of a high gain state and a low gain state.

11. The preamp of claim 1, wherein the gain control circuit is programmed to switch the gain states of the voltage amplifier in accord with a hysteresis setting.

12. The preamp of claim 1, wherein the input amplifier, voltage amplifier and gain control circuit are formed on a single integrated circuit.

13. The preamp of claim 1, further comprising an output driver that receives the second voltage and outputs a third voltage, wherein:
    the input amplifier is a transimpedance amplifier;
    the first, second and third voltages are differential voltages;
    the gain states of the voltage amplifier consist of a high gain state and a low gain state;
    the gain control circuit i) responds to the received input current by measuring an amplitude of the third voltage, and ii) is programmed to switch said gain states in accord with a hysteresis setting; and
    the input amplifier, voltage amplifier, output driver and gain control circuit are formed on a single integrated circuit.

14. An apparatus comprising:
    a preamp, comprising:
        an input amplifier that produces a first voltage in response to a received input current;
        a voltage amplifier that amplifies the first voltage to produce a second voltage, in accordance with a voltage gain that corresponds to one of a plurality of discrete gain states; and
        a gain control circuit to i) switch the gain state of the voltage amplifier in response to the received input current crossing one or more thresholds, and ii) output an indication of the voltage amplifiers current gain state to circuitry downstream from the preamp; and
    a circuit, downstream from the preamp, to receive the indication output by the gain control circuit, wherein the downstream circuit comprises an optical modulation amplitude readback circuit that generates an optical modulation amplitude readback output in response to the indication received from the gain control circuit.

15. The apparatus of claim 14, wherein the preamp further comprises an output driver that receives the second voltage and outputs a third voltage.

16. The apparatus of claim 15, wherein the gain control circuit responds to the received input current by measuring an amplitude of the third voltage.

17. The apparatus of claim 14, wherein the preamp further comprises an output driver that receives the second voltage and outputs a third voltage, wherein:
    the input amplifier is a transimpedance amplifier;
    the first, second and third voltages are differential voltages;
    the gain states of the voltage amplifier consist of a high gain state and a low gain state;
    the gain control circuit i) responds to the received input current by measuring an output swing of the third voltage, and ii) is programmed to switch said gain states in accord with a hysteresis setting; and
    the input amplifier, voltage amplifier, output driver and gain control circuit are formed on a single integrated circuit.

18. A method for widening the linear gain region of a preamp, comprising, within the preamp:
    converting a received input current to a first voltage;
    in accordance with one of a plurality of discrete gain states, amplifying the first voltage to produce a second voltage;

in response to the received input current crossing one or more thresholds, switching the gain state used for amplifying the first voltage; and outputting an indication of the preamp's current gain state to a circuit comprising an optical modulation amplitude readback circuit that generates an optical modulation amplitude readback output in response to the indication received from the gain control circuit.

19. The method of claim 18, wherein the preamp determines whether the received input current has crossed one of the thresholds by measuring an amplitude of the preamp's output.

* * * * *

UNITED STATES PATENT AND TRADEMARK OFFICE
CERTIFICATE OF CORRECTION

PATENT NO.        : 7,199,666 B2                                           Page 1 of 1
APPLICATION NO.   : 11/077045
DATED             : April 3, 2007
INVENTOR(S)       : Say Gan It is certified that error appears in the above-identified patent and that said Letters Patent is hereby corrected as shown below:

Col. 6 Line 30 In Claim 14, delete "amplifiers" and insert -- amplifier's --, therefor.

Signed and Sealed this

Sixteenth Day of December, 2008

JON W. DUDAS
*Director of the United States Patent and Trademark Office*